(12) United States Patent
Ide et al.

(10) Patent No.: US 9,631,781 B2
(45) Date of Patent: Apr. 25, 2017

(54) OPTICAL INTEGRATED DEVICE

(71) Applicant: CITIZEN HOLDINGS CO., LTD., Tokyo (JP)

(72) Inventors: Masafumi Ide, Saitama (JP); Kaoru Yoda, Nagano (JP)

(73) Assignee: CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 14/357,212

(22) PCT Filed: Nov. 8, 2012

(86) PCT No.: PCT/JP2012/079019
§ 371 (c)(1),
(2) Date: May 8, 2014

(87) PCT Pub. No.: WO2013/069743
PCT Pub. Date: May 16, 2013

(65) Prior Publication Data
US 2014/0362577 A1    Dec. 11, 2014

(30) Foreign Application Priority Data

Nov. 10, 2011    (JP) .................................. 2011-246169

(51) Int. Cl.
*F21K 2/00*    (2006.01)
*F21K 99/00*    (2016.01)
(Continued)

(52) U.S. Cl.
CPC .................. *F21K 9/56* (2013.01); *F21K 9/64* (2016.08); *G02B 6/122* (2013.01); *G02B 6/4239* (2013.01);
(Continued)

(58) Field of Classification Search
CPC ...... H05K 3/32; H05K 1/111; G02B 6/12007; G02B 6/4215; G02B 6/4232
(Continued)

(56) References Cited

U.S. PATENT DOCUMENTS 4,735,677 A    4/1988    Kawachi et al.
4,750,799 A    6/1988    Kawachi et al.
(Continued)

FOREIGN PATENT DOCUMENTS

EP    0171615 A2    2/1986
JP    S61-46911 A    3/1986
(Continued)

OTHER PUBLICATIONS

Georgakilas et al. (Dec. 30, 2002) "Wafer-Scale Integration of GaAs Optoelectronic Devices with Standard Si Integrated Circuits Using a Low-Temperature Bonding Procedure," Appl. Phys. Lett. 81:5099-5101.*
(Continued)

*Primary Examiner* — Diane Lee
*Assistant Examiner* — Gerald J Sufleta, II

(57) ABSTRACT

The invention is directed to the provision of an optical integrated device wherein provisions are made to be able to mount components on a substrate with high accuracy and high packing density without having to heat the components. The optical integrated device includes a substrate, an optical device optically coupled to a first device, and an electrical device mounted on top of the optical device or on top of a second device, wherein the optical device is bonded to the substrate by surface activated bonding via a first bonding portion formed from a metallic material on the substrate, and the electrical device is bonded to the optical device or the second device by surface activated bonding via a second
(Continued)

bonding portion formed from a metallic material on the optical device or the second device.

6 Claims, 7 Drawing Sheets

(51) Int. Cl.
    *G02B 6/42* (2006.01)
    *H01S 5/022* (2006.01)
    *G02B 6/122* (2006.01)
    *G02F 1/01* (2006.01)
    *F21K 9/64* (2016.01)
    *H01S 5/00* (2006.01)
    *H01S 5/40* (2006.01)
    *F21Y 101/00* (2016.01)
    *F21Y 115/30* (2016.01)

(52) U.S. Cl.
    CPC ........ *G02F 1/0147* (2013.01); *H01S 5/02248* (2013.01); *F21Y 2101/00* (2013.01); *F21Y 2115/30* (2016.08); *H01L 2224/48091* (2013.01); *H01L 2224/48465* (2013.01); *H01S 5/0092* (2013.01); *H01S 5/4093* (2013.01)

(58) Field of Classification Search
    USPC ...................... 362/217.08; 359/326
    See application file for complete search history.

(56) References Cited

U.S. PATENT DOCUMENTS

| | | | | |
|---|---|---|---|---|
| 5,621,837 | A * | 4/1997 | Yamada | G02B 6/42 385/88 |
| 6,208,525 | B1 * | 3/2001 | Imasu | H01L 21/563 174/255 |
| 8,399,292 | B2 * | 3/2013 | Doany | G02B 6/4246 438/106 |
| 8,581,397 | B2 * | 11/2013 | Park | H05K 1/111 257/734 |
| 8,859,337 | B2 * | 10/2014 | Gaul | H01L 23/367 257/E21.499 |
| 9,316,788 | B2 * | 4/2016 | Witzens | G02B 6/125 |
| 2004/0121520 | A1 * | 6/2004 | Karkkainen | G02B 6/423 438/107 |
| 2006/0014364 | A1 | 1/2006 | Kurita | |
| 2008/0181558 | A1 | 7/2008 | Hartwell et al. | |
| 2009/0051046 | A1 | 2/2009 | Yamazaki et al. | |
| 2011/0122481 | A1 * | 5/2011 | Ide et al. | 359/326 |
| 2013/0209112 | A1 * | 8/2013 | Witzens | G02B 6/2813 398/214 |
| 2013/0279151 | A1 * | 10/2013 | Ouderkirk | H01L 33/507 362/84 |

FOREIGN PATENT DOCUMENTS

| | | |
|---|---|---|
| JP | 2005-311298 A | 11/2005 |
| JP | 2006-019429 A | 1/2006 |
| JP | 2006-54259 A | 2/2006 |
| JP | 2007-72206 A | 3/2007 |
| JP | 2008-130969 A | 6/2008 |
| JP | 2009-076882 A | 4/2009 |
| JP | 2010-56139 A | 3/2010 |
| JP | 2011-109002 A | 6/2011 |

OTHER PUBLICATIONS

International Search Report for PCT/JP2012/079019, Dec. 25, 2012.

European Patent Office, Extended European Search Report for EP Patent Application No. 12847313.9, Oct. 23, 2015.

Cheng-Ta Ko et al., "Low Temperature Bonding Technology for 3D Integration", Microelectronics and Reliability, Mar. 24, 2011, pp. 302-311, vol. 52, No. 2, Elsevier Science Ltd., Great Britain.

Zhonghua Xu et al., "Surface Activated Bonding—High Density Packaging Solution for Advanced Microelectronic System", Electronic Packaging Technology, 6th International Conference on Shenzhen, China, Aug. 30, 2005, pp. 1-6, Piscataway, NJ.

State Intellectual Property Office of the People's Republic of China, Office Action for Chinese patent application No. 201280055252.3, Dec. 24, 2015.

Japan Patent Office, Office Action for Japanese Patent Application No. 2013-543030, Jul. 5, 2016.

\* cited by examiner

OPTICAL INTEGRATED DEVICE

TECHNICAL FIELD

The present invention relates to an optical integrated device to be used as a laser light source in various kinds of apparatus such as an optical communication or compact projector apparatus, and more particularly to an optical integrated device constructed by integrating an optical device and an electrical device on the same substrate.

BACKGROUND

It is known in the art to provide a module in which an optical device such as a laser device and an electrical device such as an IC are integrated together on the same substrate (for example, refer to patent document 1 in the list shown below). In the module disclosed in patent document 1, an optical device and an electrical device for controlling the optical device are mounted on a silicon or like substrate. Further, an optical waveguide which is optically coupled to the optical device, and which directs light to the outside, is formed on the same substrate.

In the module disclosed in patent document 1, the optical device and the electrical device are both flip-chip mounted on the substrate. That is, the optical device and the electrical device, with bumps formed on their bottom faces, are placed on the substrate with the bumps contacting with electrodes, etc. formed on the substrate, and are pressed together under heat to accomplish metal bonding.

There is also known a technique for bonding an optical device such as a laser device to a substrate by surface activated bonding (for example, refer to patent document 2 in the list shown below). Surface activated bonding is a technique that activates material surfaces by removing inactive layers such as oxides, contaminants, etc. covering the material surfaces by plasma or other means, and that bonds the surfaces together at low temperatures by causing atoms having high surface energy to contact each other and by utilizing the adhesion forces acting between the atoms.

It is also known to provide a stacked-type semiconductor device which is constructed by stacking semiconductor chips one on top of another in order to increase the packing density of the semiconductor device (for example, refer to patent document 3). In the semiconductor device disclosed in patent document 3, a through-silicon via is formed in each semiconductor chip, and the stacked semiconductor chips are electrically connected together by the through-silicon vias and solder bumps.

PRIOR ART DOCUMENTS

Patent Documents

Patent document 1: Japanese Unexamined Patent Publication No. 2007-72206
Patent document 2: Japanese Unexamined Patent Publication No. 2005-311298
Patent document 3: Japanese Unexamined Patent Publication No. 2010-56139

SUMMARY

However, in the prior art integrated devices described above, since functional devices formed from dissimilar materials are mounted together on a base substrate in order to produce a high-functionality integrated device, deformation due to thermal history builds up in the case of a base substrate on which an optical waveguide is formed. Due to optical axis misalignment, etc. caused by such deformation buildup, it has not been possible to optically couple the optical device mounted on the substrate precisely to the waveguide formed on the substrate. In particular, as the number of optical devices and electrical devices to be mounted increases, increasing the number of process steps, the amount of buildup of deformation due to the thermal history of the base substrate increases, making it even more difficult to optically couple each optical device mounted on the substrate precisely to the optical waveguide formed on the substrate. That is, in order to achieve a precise optical coupling between the optical device and the optical waveguide, it is necessary to align the optical device with the optical waveguide with a submicron-order accuracy. However, it has been difficult to achieve such an accurate alignment.

When the optical device and the optical waveguide are flip-chip mounted, as described in patent document 1, since the optical device, the optical waveguide, and the substrate are heated, there has been the problem that the component members may become displaced relative to each other because of differences in thermal expansion coefficients between the respective component members.

In the case of bonding the optical device by surface activated bonding after flip-chip mounting the electrical device, as described in patent document 2, since the substrate is heated at high temperature when mounting the electrical device, the substrate warps, thus adversely affecting the positioning accuracy when bonding the optical device by surface activated bonding.

A similar problem occurs when mounting chips, each having a through-silicon via, in three dimensions by using solders in order to increase the packing density of the semiconductor device, as described in patent document 3, because, in this case also, the chips and the substrate are heated at high temperature in soldering steps, etc. performed by reflowing the solder. As described above, in the prior art, it has been difficult to implement a device having an optical device with high accuracy and high packing density.

It is an object of the present invention to provide an optical integrated device that can overcome the above deficiencies.

It is also an object of the present invention to provide an optical integrated device wherein provisions are made to be able to mount components on a substrate with high accuracy and high packing density without having to heat the components.

According to the present invention, there is provided an optical integrated device includes a substrate, an optical device optically coupled to a first device, and an electrical device mounted on top of the optical device or on top of a second device, wherein the optical device is bonded to the substrate by surface activated bonding via a first bonding portion formed from a metallic material on the substrate, and the electrical device is bonded to the optical device or the second device by surface activated bonding via a second bonding portion formed from a metallic material on the optical device or the second device.

Preferably, in the optical integrated device, the first device is a laser diode, and the optical device is a wavelength conversion device that outputs light by wavelength-converting laser light emitted by the laser diode.

Preferably, in the optical integrated device, the electrical device is a temperature controlling IC that controls the temperature of the wavelength conversion device, and the temperature controlling IC is bonded to the wavelength conversion device by surface activated bonding via the second bonding portion formed on the wavelength conversion device.

Preferably, in the optical integrated device, the electrical device is a first IC that performs electrical processing, the second device is a second IC that performs another electrical processing, and the first IC is bonded to the second IC by surface activated bonding via the second bonding portion formed on the second IC.

Preferably, in the optical integrated device, the first device is a laser diode, the optical device is a wavelength conversion device that outputs light by wavelength-converting laser light emitted by the laser diode, the first IC is a driver IC for driving the laser diode, and the second IC is a temperature controlling IC that controls the temperature of the wavelength conversion device.

Preferably, in the optical integrated device, the first device is a laser diode, and the optical device is a wavelength conversion device that outputs light by wavelength-converting laser light emitted by the laser diode, wherein the optical integrated device further comprises a spacer placed between the laser diode and the substrate.

Preferably, in the optical integrated device, a micro-bump structure of Au for bonding the laser diode and a solid pattern of Au for equalizing pressing force applied from above the spacer are formed on an upper surface of the spacer.

Preferably, in the optical integrated device, the first and second bonding portions each have a micro-bump structure of Au.

Preferably, in the optical integrated device, the bonding accomplished by the surface activated bonding serves not only to electrically connect the electrical device to the substrate, but also to firmly secure the electrical device in position.

In the optical integrated device, all the devices constituting it are bonded by surface activated bonding via bonding portions formed from a metallic material, and at least two of these devices are stacked one on top of the other and bonded together by surface activated bonding. It thus becomes possible to mount the components on the substrate with high accuracy and high packing density, while eliminating the need to heat the components as in the prior art.

DESCRIPTION

An optical integrated device will be described below with reference to the drawings. It will, however, be noted that the technical scope of the present invention is not limited by any particular embodiment described herein, but extends to the inventions described in the appended claims and their equivalents. The following description is given by taking as an example an optical integrated device, etc. on which a wavelength conversion device for converting light emitted by an LD device into its second harmonic is mounted together with an electrical device.

Figure 1:
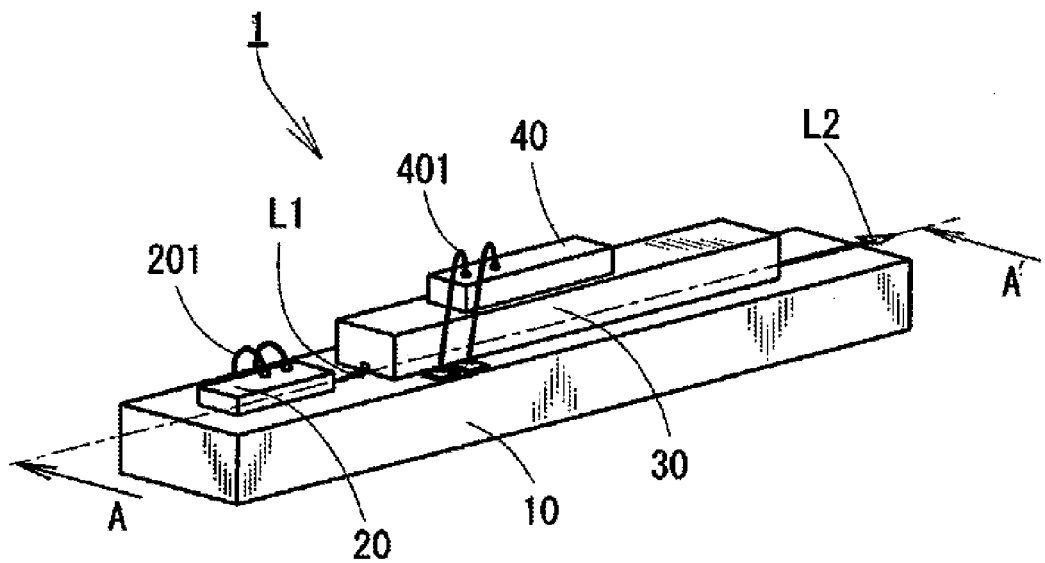
FIG. 1 is an external view of an optical integrated device 1.
Figure 2:
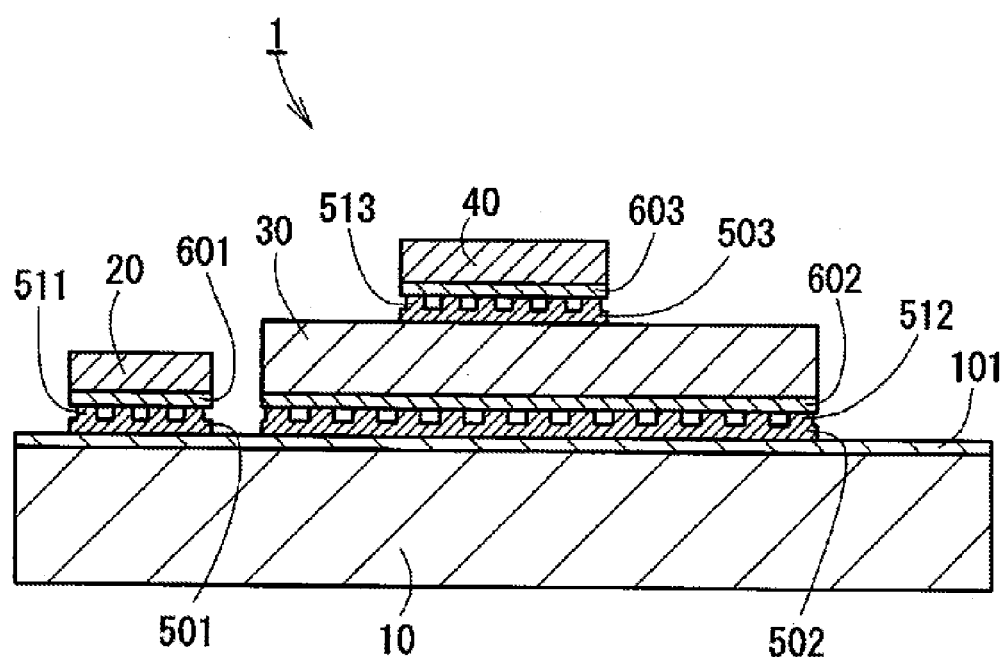
FIG. 2 is a cross-sectional view taken along line AA' in FIG. 1.

FIG. 1 is an external view of an optical integrated device 1, and FIG. 2 is a cross-sectional view taken along line AA' in FIG. 1.

As shown in FIG. 1, optical devices, i.e., a laser diode 20 (hereinafter abbreviated to LD) formed from a material such as GaAs, GaN, or the like and a wavelength conversion device 30 having a waveguide of lithium niobate (PPLN, LiNbO3), are positioned relative to each other and bonded onto the upper surface of a silicon substrate 10 (hereinafter called the Si platform) to form the optical integrated device 1. A temperature controlling IC 40 is mounted on top of the wavelength conversion device 30 by bonding. The optical integrated device 1 forms an optical-electrical hybrid integrated circuit that contains both optical and electrical devices to achieve increased packing density. The Si platform 10 includes interconnection patterns, lands, logic LSI, temperature sensor, etc. formed on the silicon substrate, and further includes waveguides, etc. that form optical interconnects, circuits, etc. on the silicon substrate.

The LD device 20 and the temperature controlling IC 40 are electrically connected to the Si platform 10 by bonding wires 201 and 401, respectively, via which power is supplied. The LD device 20 and the wavelength conversion device 30 are positioned with their optical axes aligned such that the light emitted from the LD device 20 is aligned with a submicron-order accuracy with the entrance face of the optical waveguide formed within the wavelength conversion device 30.

The operation of the optical integrated device 1 will be briefly described below. When drive power is supplied from the Si platform 10 via the bonding wires 201, the LD device 20 emits infrared light L1 of wavelength 1064 nm. The wavelength conversion device 30 converts the infrared light L1 introduced through the entrance face of the optical waveguide into light at its harmonic wavelength as the light propagates through the optical waveguide, and outputs green laser light L2. The above combination of the LD device 20 and the wavelength conversion device 30 is only one example, and other devices or other device combinations may be used. That is, by changing the combination of the LD device 20 and the wavelength conversion device 30, the optical integrated device 1 can produce laser light of various colors.

The temperature controlling IC 40 mounted directly on the wavelength conversion device 30 by bonding includes a heater and a temperature sensor. The temperature controlling IC 40 is supplied with drive power from the Si platform 10 via the bonding wires 401, and performs temperature control (electrical processing) so as to maintain the temperature of the wavelength conversion device 30 at 40° C.±10° C. With this temperature control, the wavelength conversion device 30 can maintain high harmonic wavelength conversion efficiency and stable laser light output at the harmonic wavelength.

Since the temperature controlling IC 40 is mounted on the wavelength conversion device 30 in three dimensions, not only can the temperature of the wavelength conversion device be controlled directly, but the packing density can be also increased, thus achieving the compact design of the optical integrated device 1.

As shown in FIG. 2, a silicon dioxide film 101 is formed on the upper surface of the Si platform 10. The silicon dioxide film 101 serves as an insulating film and provides insulation to the interconnection patterns, etc. except the land portion where the electrical devices can be electrically connected. A bonding portion 501 containing micro bumps 511 of Au is formed in the region on the Si platform 10 where the LD device 20 is to be bonded. An Au film 601 is formed on the lower surface of the LD device 20. The Au film 601 formed on the LD device 20 is bonded to the Au micro bumps 511 by surface activated bonding.

An Au film 602 formed on the lower surface of the wavelength conversion device 30 is bonded by surface activated bonding to Au micro bumps 512 (bonding portion 502) formed on the Si platform 10. The bonding portion 502 is not bonded over the entire lower surface of the wavelength conversion device 30. If a metallic material such as Au is present near the optical waveguide, the characteristics of the optical waveguide will be adversely affected; therefore, the wavelength conversion device 30 is bonded to the Si platform 10 at portions excluding at least the portion corresponding to the width of the optical waveguide and extending longitudinally along the length of the optical waveguide.

The temperature controlling IC 40 is bonded to the wavelength conversion device 30 by lamination bonding to increase the packing density, and the temperature of the wavelength conversion device is directly controlled by the temperature controlling IC 40 which includes the heater and temperature sensor. A bonding portion 503 containing Au micro bumps 513 is formed in the region where the temperature controlling IC 40 is bonded to the wavelength conversion device 30. The Au micro bumps 513 are bonded by surface activated bonding to an Au film 603 formed on the lower surface of the temperature controlling IC 40.

Since the bonding temperature associated with the above surface activated bonding is 150° C. at highest and is thus within the normal temperature range, no positional displacement occurs during the bonding of the LD device 20 and the wavelength conversion device 30 which requires an extremely high optical axis alignment accuracy. After the bonding, if the temperature controlling IC 40 is bonded by lamination bonding, no positional displacement occurs between the LD device 20 and the wavelength conversion device 30 due to heating, nor does any problem such as functional degradations due to thermal stresses to the devices occur.

Figure 3A:
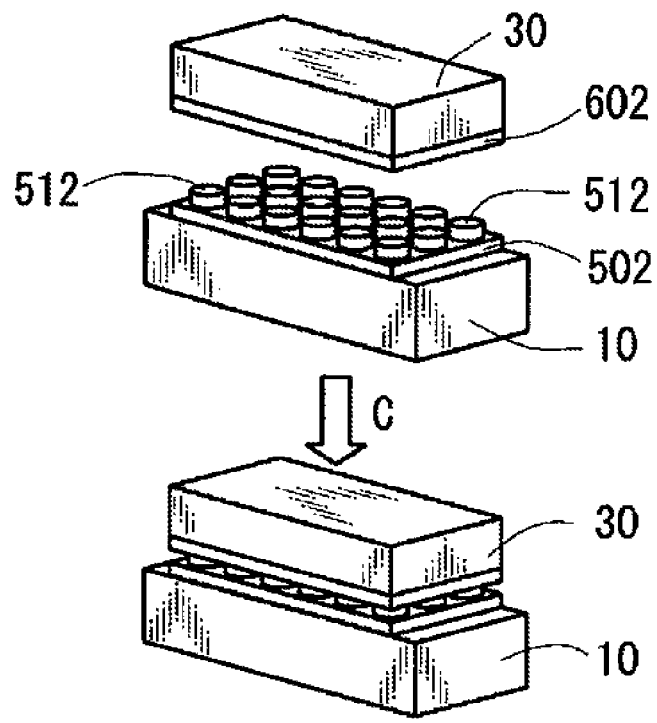
FIG. 3(a) is a perspective view for explaining how a wavelength conversion device 30 is bonded to an Si platform 10.
Figure 3B:
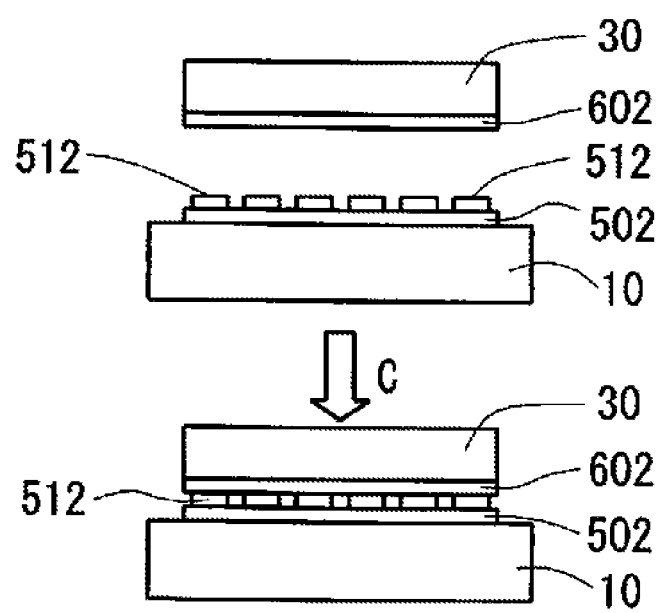
FIG. 3(b) is a side view for explaining how the wavelength conversion device 30 is bonded to the Si platform 10.

FIG. 3(*a*) is a perspective view for explaining how the wavelength conversion device 30 is bonded to the Si platform 10, and FIG. 3(*b*) is a side view for explaining how the wavelength conversion device 30 is bonded to the Si platform 10. In FIGS. 3(*a*) and 3(*b*), the same component elements are designated by the same reference numerals, and any description once given will not be repeated.

As shown in the upper part of each of FIGS. 3(*a*) and 3(*b*), the bonding portion 502 formed on the upper surface of the Si platform 10 has a micro-bump structure that contains numerous cylindrically shaped Au micro bumps 512. For example, the micro bumps 512 are each 5 μm in diameter and 2 μm in height, and are arranged at a pitch of 10 to 25 μm. On the other hand, the Au film 602 is formed on the lower surface of the wavelength conversion device 30, that is, the surface to be bonded to the Si platform 10.

First, the Si platform 10 and the wavelength conversion device 30 are placed in an atmosphere evacuated to about 6 to 8 Pa, and surface activation is performed using argon plasma to remove inactive layers, such as oxides, contaminants (dirt), etc., that cover the Au film 602 of the wavelength conversion device 30 and the surfaces of the micro bumps 512 on the Si platform 10.

Next, as shown in the lower part of each of FIGS. 3(*a*) and 3(*b*), the wavelength conversion device 30 is placed on the Si platform 10 and pressed together by applying a load (for example, 5 to 10 Kgf/mm$^2$) in an atmosphere held at normal temperature not higher than 150° C. The micro bumps 512 are slightly crushed and deformed in the thickness direction under the applied load, but the Si platform 10 and the wavelength conversion device 30 are securely bonded together by the covalent bonding of Au atoms.

In this way, the bonding by the surface activated bonding can be accomplished within the normal temperature range not higher than 150° C., and even if components such as optical and electrical devices are laminated and bonded together, the devices do not suffer any problems such as positional displacement, functional degradation due to thermal stresses, or component breakage due to residual stresses arising from differences in thermal expansion coefficient.

Figure 4A:
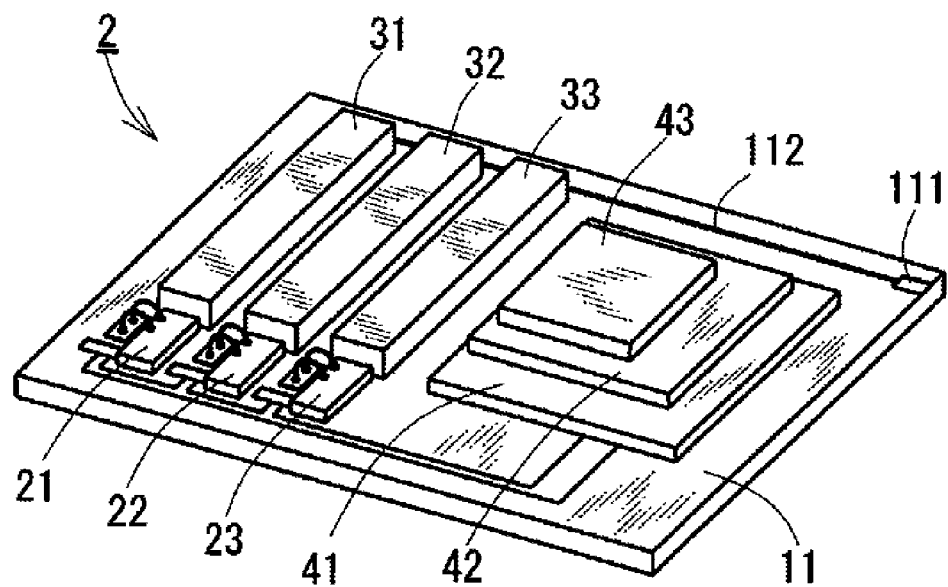
FIG. 4(a) is a perspective view for explaining the external appearance of an alternative optical integrated device 2.
Figure 4B:
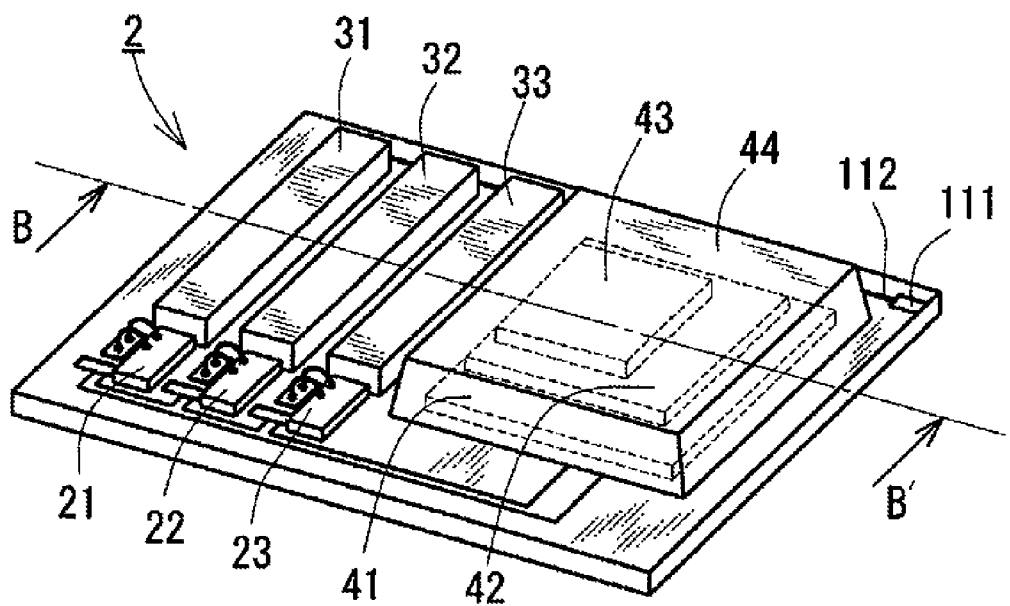
FIG. 4(b) is a perspective view for explaining the structure of the alternative optical integrated device 2 in which bare-chip electrical devices laminated and bonded together are sealed with a sealing member.
Figure 5:
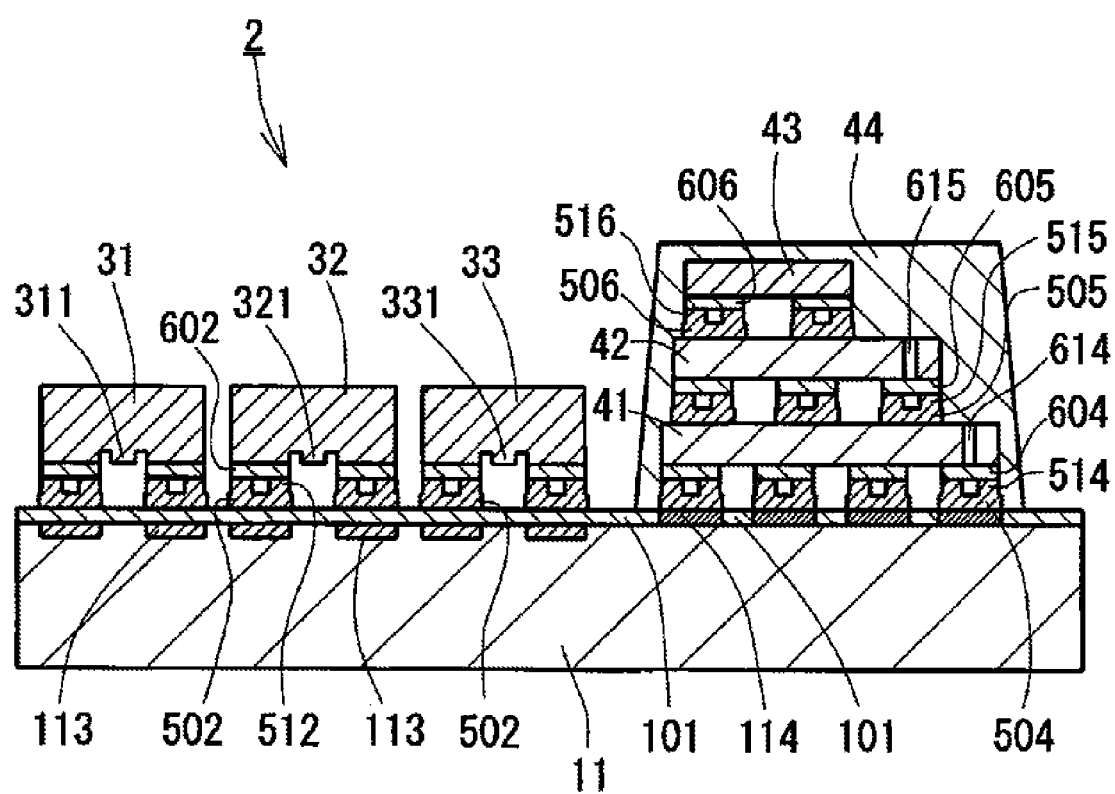
FIG. 5 is a cross-sectional view taken along line BB' in FIG. 4(b).

FIG. 4(*a*) is a perspective view for explaining the external appearance of an alternative optical integrated device 2, and FIG. 4(*b*) is a perspective view for explaining the structure of the optical integrated device 2 in which bare-chip electrical devices laminated and bonded are sealed with a sealing member. FIG. 5 is a cross-sectional view taken along line BB' in FIG. 4(*b*).

Unlike the optical integrated device 1 that emits monochromatic light, the alternative optical integrated device 2 is an optical integrated device capable of emitting three different colors, for example, three primary colors such as used in a compact projector or the like.

As shown in FIG. 4(*a*), in common with the optical integrated device 1, the optical integrated device 2 is constructed by integrating various kinds of components such as optical devices and electrical devices on an Si platform 11. The Si platform 11 has an electrical configuration comprising a CPU, a CMOS LSI (integrated circuit) such as a memory, interconnection patterns, lands, temperature sensors, heaters, etc.

formed thereon. Further, the Si platform 11 has an optical configuration comprising a waveguide 112 formed thereon as an optical circuit that combines RGB lights emitted from wavelength conversion devices 31, 32, and 33 and that guides the combined light through to a port 111.

Three LD devices 21, 22, and 23 are mounted on the Si platform 11. Three laser lights emitted from the respective LD devices 21 to 23 are converted into the R, G, and B lights corresponding to the three primary colors of light by the three wavelength conversion devices 31 to 33, respectively. However, the wavelength conversion device 31 for the R light may be omitted, and the R component light emitted from the LD device 21 may be directly introduced.

In the optical integrated device 2, a plurality of ICs for performing electrical processing are mounted one on top of another on the Si platform 11; that is, a driver IC 41, a video controller IC 42, and a temperature controlling IC 43 are stacked one on top of another in the order named. Since the packing density is increased by stacking the three kinds of electrical devices in three dimensions, the optical integrated device 2 can be reduced in size.

A sealing material (for example, epoxy-based resin) is applied by potting using a dispenser from above the plurality of electrical devices mounted in the form of bare chips as shown in FIG. 4(*a*), and the material is cured at normal temperature to form the sealing member 44 as shown in FIG. 4(*b*). The driver IC 41, the video controller IC 42, and the temperature controlling IC 43 are not only firmly secured in position but also hermetically sealed and protected by the sealing member 44.

Signals supplied from an apparatus (for example, a compact projector) incorporating the optical integrated device 2 are converted by the video controller IC 42 into graphic processed signals. Based on the thus converted signals, the driver IC 41 supplies drive power to the LD devices 21 to 23 acting as light sources for the RGB lights.

The LD devices 21 to 23 output laser lights based on the supplied drive power, and the output lights of the LD devices 21 to 23 are wavelength-converted by the respective wavelength conversion devices 31 to 33 into the R, G, and B lights for output. The R, G, and B lights output from the wavelength conversion devices 31 to 33 are combined in the waveguide 112 formed on the Si platform 11, and the combined light is emitted from the port 111. The wavelength conversion devices 31 to 33 are controlled within a prescribed temperature range to achieve excellent conversion efficiency and stability, by the temperature sensors and heaters formed in the Si platform 11 and the temperature controlling IC 43 which controls the heaters based on the signals from the temperature sensors.

As shown in FIG. 5, the wavelength conversion devices 31 to 33 are bonded to the Si platform 11 by surface activated bonding in the same manner as described for the optical integrated device 1. More specifically, the bonding portions 502, each having micro bumps 512, formed on the Si platform 11 and the Au films 602 formed on the respective wavelength conversion devices 31 to 33 are bonded together by surface activated bonding at portions excluding the portions at and near the respective optical waveguides 311, 312, and 313.

The heater 113 and the temperature sensor, not shown, are formed in the Si platform 11 under each bonding portion 502, and the temperature controlling IC 43 performs temperature control so that the wavelength conversion devices 31 to 33 are maintained at optimum temperature.

A silicon dioxide film 101 is formed on the upper surface of the Si platform 11, and as in the case of the optical integrated device 1, the silicon dioxide film 101 serves as an insulating film and provides insulation to the interconnection patterns, etc. except the land portion 114 where the electrical devices can be electrically connected. Further, the silicon dioxide film 101 together with a silicon nitride film, not shown, forms the waveguide 112 (see FIG. 4) as an optical circuit.

The driver IC 41, the video controller IC 42, and the temperature controlling IC 43, mounted in three dimensions on the Si platform 11, are formed with through-silicon vias by which the plurality of chips can be electrically interconnected.

A plurality of bonding portions 504 are formed in the land portion 114 in the region where the driver IC 41 is mounted on the Si platform 11, and each bonding portion 504 is formed with Au micro bumps 514. Au films 604 formed at positions where the electrodes and the through-silicon via 614 are respectively located on the lower surface of the driver IC 41 are bonded to the micro bumps 514 of the respective bonding portions 504 by surface activated bonding. The bonding portions between the Si platform 11 and the driver IC 41 not only provide electrical connections, but also serve to firmly secure them in position.

The driver IC 41 and the video controller IC 42 are also bonded together in a similar manner. That is, a plurality of bonding portions 505 are formed in the electrode portions (not shown) in the region where the video controller IC 42 is mounted on the driver IC 41, and each bonding portion 505 is formed with Au micro bumps 515. Au films 605 formed at positions where the electrodes and the through-silicon via 615 are respectively located on the lower surface of the video controller IC 42 are bonded to the micro bumps 515 of the respective bonding portions 505 by surface activated bonding. The bonding portions between the driver IC 41 and the video controller IC 42 not only provide electrical connections, but also serve to firmly secure them in position.

The video controller IC 42 and the temperature controlling IC 43 are also bonded together in a similar manner. That is, a plurality of bonding portions 506 which also serve as electrodes are formed on the video controller IC 42, and each bonding portion 506 is formed with Au micro bumps 516. Au films 606 formed at positions where the electrodes are located on the lower surface of the temperature controlling IC 43 are bonded to the micro bumps 516 of the respective bonding portions 506 by surface activated bonding. The bonding portions between the video controller IC 42 and the temperature controlling IC 43 not only provide electrical connections, but also serve to firmly secure them in position.

Since the plurality of electrical devices thus laminated and bonded together are bare chips exposed to the outside environment, the sealing member 44 is formed to firmly secure the electrical devices in position and to hermetically seal and protect them against the outside environment. The video controller IC 42 may be omitted, and the temperature controlling IC 43 may be bonded to the driver IC by surface activated bonding.

The electrical devices are bonded to the Si platform 11 by surface activated bonding at near normal temperatures. Accordingly, even when the electrical devices are laminated and bonded together (mounted in three dimensions) after the optical devices have been bonded to the Si platform 11 by aligning the optical axis of each LD device with the optical axis of the corresponding wavelength conversion device with a submicron-order accuracy, the devices do not suffer any problems such as positional displacement between the optical devices, functional degradation of the optical devices due to thermal stresses, or breakage of the optical devices due to residual stresses arising from differences in thermal expansion coefficient.

If the order of the bonding steps is reversed, and the electrical device lamination bonding step (three-dimensional mounting step) is performed first, the Si platform 11 as the substrate suffers hardly any distortion or deformation, since the bonding is accomplished by surface activated bonding at near normal temperatures. Accordingly, the optical devices can be bonded to the Si platform 11 by aligning the optical axis of each LD device with the optical axis of the corresponding wavelength conversion device with a submicron-order accuracy.

Figure 6:
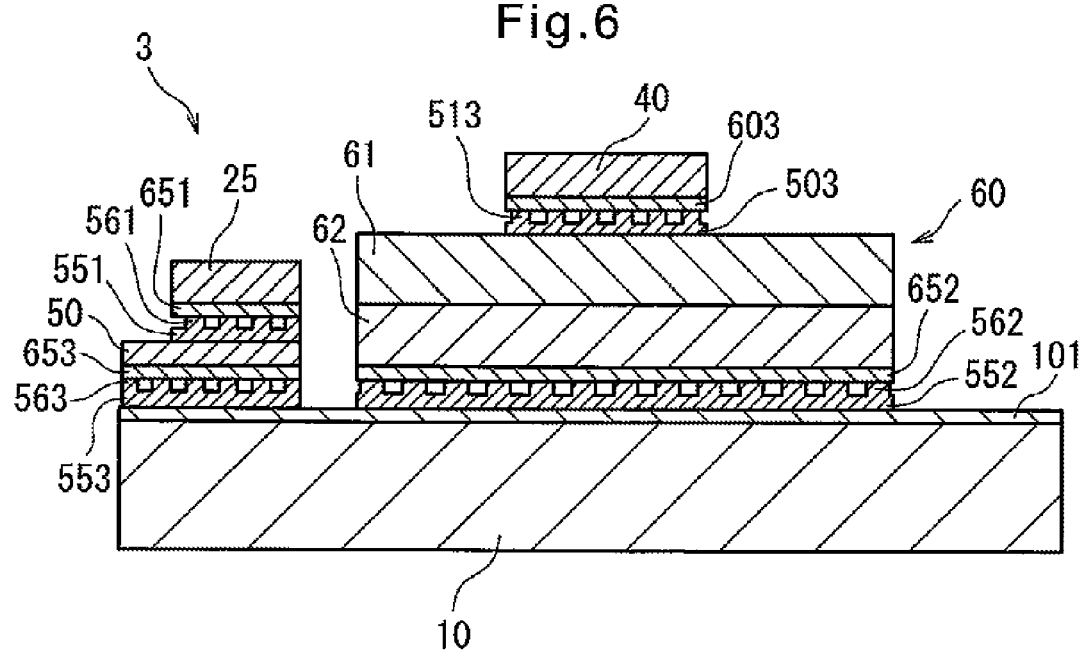
FIG. 6 is a cross-sectional view of a further alternative optical integrated device 3.

FIG. 6 is a cross-sectional view of a further alternative optical integrated device 3.

Like the optical integrated device 1, the optical integrated device 3 is an optical integrated device that emits monochromatic light. In the optical integrated device 3, a lidded wavelength conversion device 60 is used in place of the wavelength conversion device 30 used in the optical integrated device 1. The lidded wavelength conversion device 60 is made up of a wavelength conversion portion 61 and a lid portion 62, and an optical waveguide is formed along the interface between the wavelength conversion portion 61 and the lid portion 62. In the optical integrated device 3, the same component elements as those of the optical integrated device 1 are designated by the same reference numerals, and the description of such component elements will not be repeated here.

Because of the use of the lidded wavelength conversion device 60, the position of the optical waveguide moves from the surface of the Si platform 10 to a position above the surface (for example, about 0.5 mm above it), and as a result, the position to which the laser light from the LD device 25 is to be projected has to be moved to a corresponding position above the surface. Therefore, in the optical integrated device 3, a height adjusting Si spacer 50 is placed on the Si platform 10, and the LD device 25 is mounted on the Si spacer 50. Thus, in the optical integrated device 3, the optical alignment between the LD device 25 mounted on the Si spacer 50 and the lidded wavelength conversion device 60 can be accomplished with a submicron-order accuracy.

The operation of the optical integrated device 3 will be briefly described below. When drive power is supplied directly from the Si platform 10 via the bonding wires (not shown), the LD device 25 mounted on the Si spacer 50 emits infrared light L1 of wavelength 1064 nm. The lidded wavelength conversion device 60 converts the infrared light L1 introduced through the entrance face of the optical waveguide into light at its harmonic wavelength as the light propagates through the optical waveguide, and outputs green laser light L2. The above combination of the LD device 25 and the lidded wavelength conversion device 60 is only one example, and other devices or other device combinations may be used. That is, by changing the combination of the LD device 25 and the lidded wavelength conversion device 60, the optical integrated device 3 can produce laser light of various colors.

As shown in FIG. 6, a silicon dioxide film 101 is formed on the upper surface of the Si platform 10.

The silicon dioxide film 101 serves as an insulating film and provides insulation to the interconnection patterns, etc. except the land portion where the electrical devices can be electrically connected. A bonding portion 553 containing micro bumps 563 of Au is formed in the region on the Si platform 10 where the Si spacer 50 is to be bonded. An Au film 653 is formed on the lower surface of the Si spacer 50. The Au film 653 formed on the Si spacer 50 is bonded to the Au micro bumps 563 by surface activated bonding.

An Au film 652 formed on the lower surface of the lidded wavelength conversion device 60 is bonded by surface activated bonding to Au micro bumps 562 (bonding portion 552) formed on the Si platform 10. In the lidded wavelength conversion device 60, since the optical waveguide is formed along the interface between the wavelength conversion portion 61 and the lid portion 62, the entire lower surface of the lidded wavelength conversion device 60 is bonded to the Si platform 10, unlike the optical integrated device 1.

The LD device 25 is bonded to the Si spacer 50 by lamination bonding. A bonding portion 551 containing Au micro bumps 561 is formed in the region where the LD device 25 is bonded to the Si spacer 50. The Au micro bumps 561 are bonded by surface activated bonding to an Au film 651 formed on the lower surface of the LD device 25. The bonding between the Si spacer 50 and the Si platform 10 and the bonding between the Si spacer 50 and the LD device 25 are both accomplished by surface activated bonding. This makes it possible to highly accurately maintain the position of the LD device 25 above the Si platform 10 (in the height direction).

The temperature controlling IC 40 is bonded to the lidded wavelength conversion device 60 by lamination bonding to increase the packing density, and the temperature of the wavelength conversion device is directly controlled by the temperature controlling IC 40 which includes a heater and a temperature sensor. A bonding portion 503 containing Au micro bumps 513 is formed in the region where the temperature controlling IC 40 is bonded to the lidded wavelength conversion device 60. The Au micro bumps 513 are bonded by surface activated bonding to the Au film 603 formed on the lower surface of the temperature controlling IC 40.

Since the bonding temperature associated with the above surface activated bonding is 150° C. at highest and is thus within the normal temperature range, no positional displacement occurs during the bonding of the Si spacer 50 and the lidded wavelength conversion device 60, which requires an extremely high optical axis alignment accuracy. After the bonding, if the LD device 25 and the temperature controlling IC 40 are respectively bonded by lamination bonding, no positional displacement occurs between the LD device 25 and the lidded wavelength conversion device 60 due to heating, nor does any problem such as functional degradation due to thermal stresses to the devices occur.

In the optical integrated device 3, three optical integrated devices may be mounted on a single Si platform in order to emit the R, G, and B lights, as in the case of the optical integrated device 2.

Figure 7:
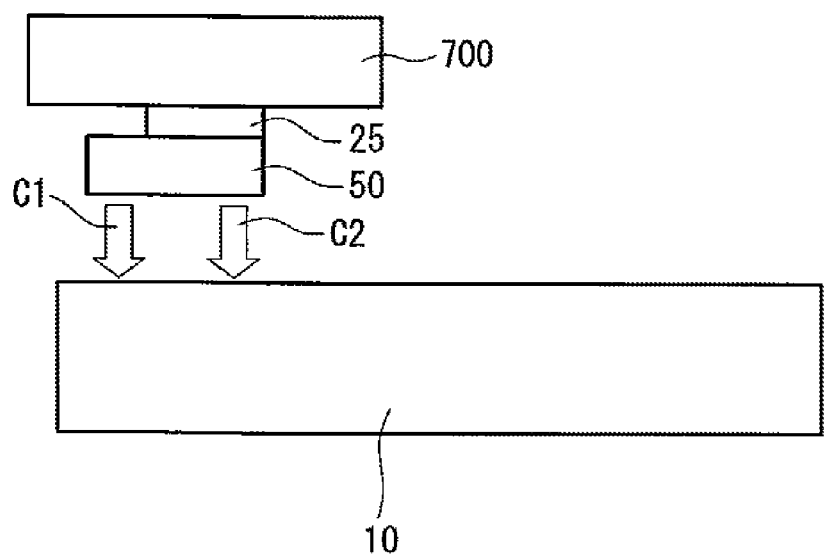
FIG. 7 is a diagram for explaining how an LD device 25 is mounted by bonding.

FIG. 7 is a diagram for explaining how the LD device 25 is mounted by bonding.

When mounting the LD device 25 by bonding, first the LD device 25 may be bonded to the Si spacer 50 by lamination bonding, and then the component fabricated by bonding the LD device 25 to the Si spacer 50 may be bonded to the Si platform 10. FIG. 7 is a schematic diagram illustrating such a bonding process.

The LD device 25 is bonded to the Si spacer 50 by displacing its center from the center of the Si spacer 50 (see FIG. 9(*a*)). That is, the light-emitting face of the LD device 25 is positioned slightly past the end of the Si spacer 50 in order to bring the LD device 25 closer to the wavelength conversion device 60 and to prevent the Si spacer 50 from interfering with the light emitted from the LD device 25. This may cause a problem when mounting the component fabricated by bonding the LD device 25 to the Si spacer 50 onto the Si platform 10 by bonding. As earlier described, pressure needs to be applied using a pressing head 700 (see FIG. 8(*a*)) from above the structure in order to bond the Si spacer 50 to the micro bumps 563 formed on the Si platform 10. However, the pressing force exerted on the Si platform 10 varies depending on where on the Si spacer 50 the LD device 25 is placed. For example, in the case of FIG. 7, the pressing force C1 is smaller than the pressing force C2. If an uneven load is applied to the Si spacer 50, the bonding between the Si spacer 50 and the Si platform 10 may be adversely affected.

Figure 8A:
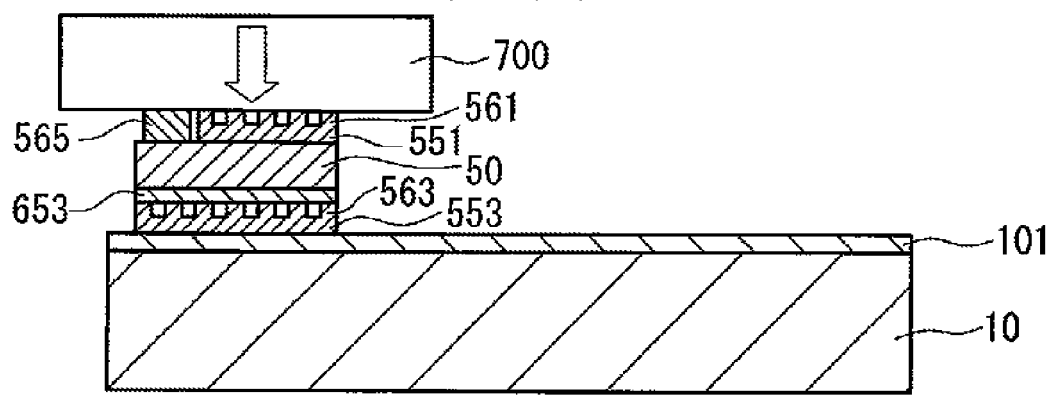
FIG. 8(a) is a diagram (1) for explaining the steps for bonding the LD device 25.
Figure 8B:
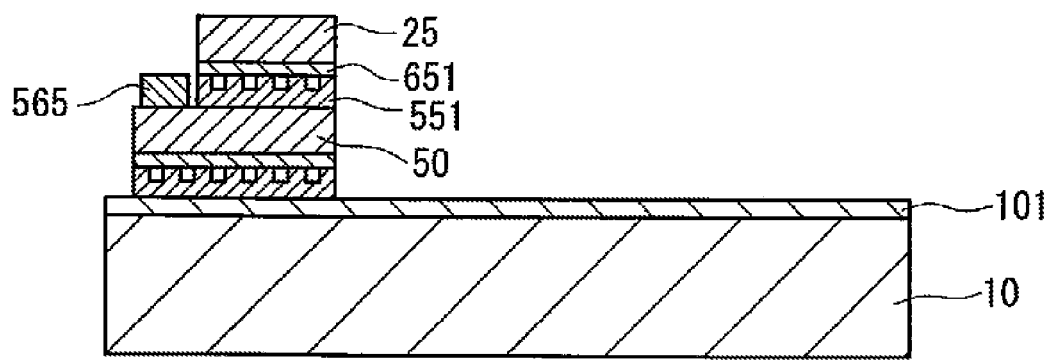
FIG. 8(b) is a diagram (2) for explaining the steps for bonding the LD device 25.

FIGS. 8(a) and 8(b) are diagrams for explaining the steps for bonding the LD device 25.

As shown in FIG. 8(a), using mounting equipment or the like, the Si spacer 50 is placed on the Au micro bumps 563 of the bonding portion 553. The Au film 653 is formed on lower surface of the Si spacer 50, while the Au micro bumps 561 of the bonding portion 551 and a solid pattern 565 of Au are formed on the upper surface of the Si spacer (see FIG. 9(b)).

Next, the pressing head 700 is pressed against the Si spacer 50 from above so that the Au micro bumps 563 and the Au film 653 are bonded together by surface activated bonding. Since the lower surface of the pressing head 700 is formed from glass, the lower surface will not bond to the micro bumps 561, the solid pattern 565, etc. formed on the upper surface of the Si spacer. Further, the micro bumps 561, the solid pattern 565, etc. are formed so as to have the same height and so as to cover the entire upper surface of the Si spacer 50 (see FIG. 9(b)). Accordingly, when the pressing head 700 is pressed against the Si spacer 50 from above, the bonding between the Si spacer 50 and the Si platform 10 will not be adversely affected, since the load is applied evenly on the Si spacer 50. That is, in the step shown in FIG. 8(a), the problem described with reference to FIG. 7 does not occur.

Figure 9A:
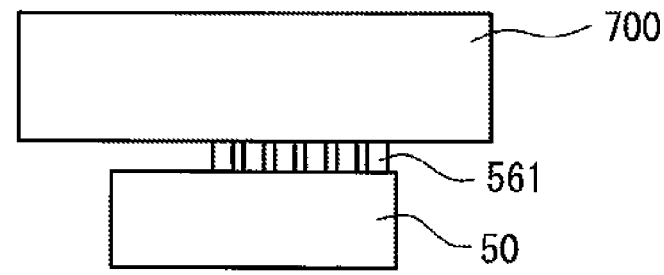
FIG. 9(a) is a diagram (1) for explaining the bonding portion formed on an Si spacer 50.
Figure 9A:
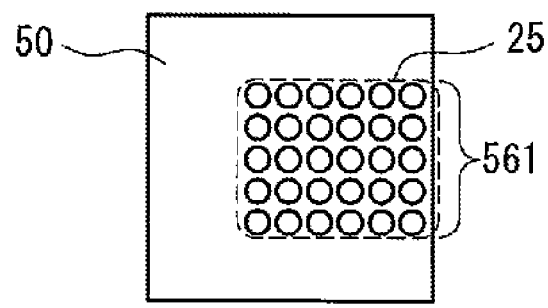
Figure 9B:
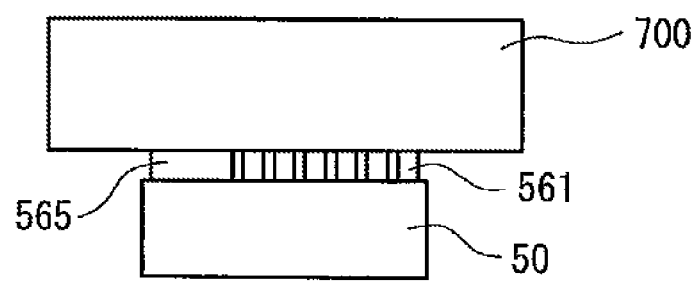
FIG. 9(b) is a diagram (2) for explaining the bonding portion formed on the Si spacer 50.
Figure 9B:
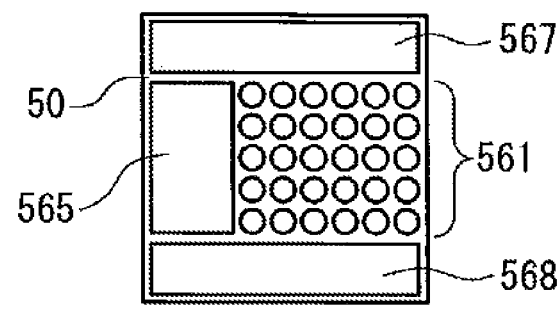

FIG. 9(a) is a schematic diagram for explaining the upper surface of the Si spacer 50 shown in FIG. 7, and FIG. 9(b) is a schematic diagram for explaining the upper surface of the Si spacer 50 shown in FIG. 8(a). In FIGS. 9(a) and 9(b), the upper part shows the relationship between the Si spacer 50 and the pressing head 700, and the lower part shows a top plan view of the Si spacer 50.

As previously described with reference to FIG. 7, when the LD device 25 is bonded off center to the Si spacer 50, the pressing force being applied by the pressing head 700 (not shown) to the Si spacer 50 varies from position to position. Such variations in pressing force may adversely affect the bonding between the Si spacer 50 and the Si platform 10. One possible method to address this problem would be to first bond the Si spacer 50 to the Si platform 10 and then bond the LD device 25 onto the Si spacer 50.

However, as shown in FIG. 9(a), the micro bumps 561 are formed on the Si spacer 50 only in the portion indicated by dashed lines where the LD device 25 is to be bonded. As a result, when mounting the Si spacer 50 first, if the pressing head 700 is pressed against the Si spacer 50 from above, the micro bumps 561 may be crushed under pressure, rendering the micro bumps 561 unusable when mounting the LD device 25 subsequently.

In the example shown in FIG. 9(b), not only the micro bumps 561, but also the solid patterns of Au, 565, 567, and 568, are formed on the upper surface of the Si spacer 50. Since the micro bumps 561 and the Au solid patterns 565, 567, and 568 are formed so as to have the same height, the pressing force from the pressing head 700 is exerted evenly on the Si spacer 50. This serves to reduce the chance of crushing the micro bumps 561 under pressure when mounting the Si spacer 50.

Further, the Au solid patterns 565, 567, and 568 can be formed simultaneously with the Au micro bumps 561 (Au thin film deposition step and etching step), and there is no need to add an extra fabrication step. The solid patterns shown in FIG. 9(b) are only examples, and their sizes, positions, etc. may be appropriately determined according to the position at which the micro bumps 561 are formed to match the size and position of the LD device 25 to be bonded. The solid patterns need not necessarily be provided at three places, but may be provided at one or two places, as long as the pattern or patterns are formed so that the pressing force from the pressing head 700 can be applied substantially evenly.

As shown in FIG. 8(b), after the Si spacer 50 has been bonded to the Si platform 10, the LD device 25 is placed, using mounting equipment or the like, onto the Au micro bumps 561 formed in the bonding portion 551. The Au film 651 is formed on the lower surface of the LD device 25.

Figure 8C:
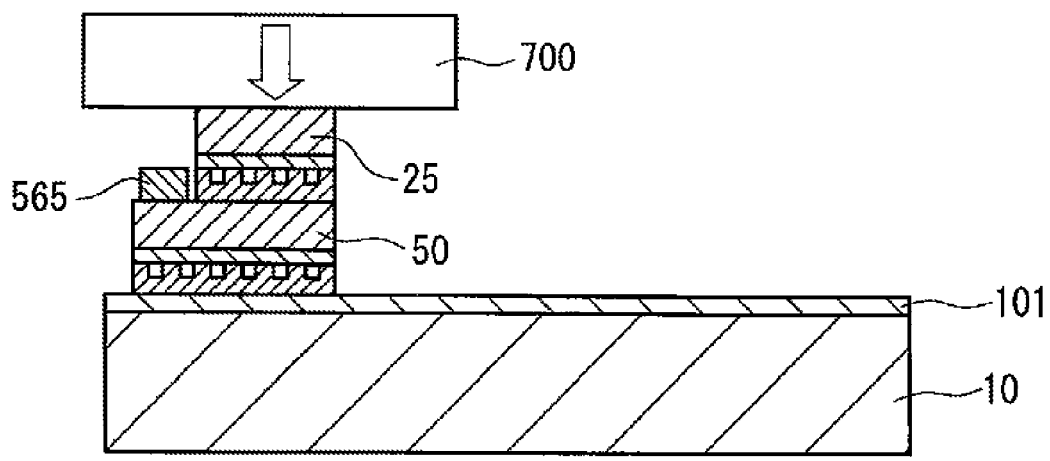
FIG. 8(c) is a diagram (3) for explaining the steps for bonding the LD device 25.

As shown in FIG. 8(c), the pressing head 700 is pressed against the LD device 25 from above so that the Au micro bumps 561 and the Au film 651 are bonded together by surface activated bonding. Since the LD device 25 is not placed on the solid patterns 565 to 568, but placed on the Au micro bumps 561, the presence of the solid patterns 565 to 568 on the upper surface of the Si spacer 50 does not affect the bonding between the LD device 25 and the Si spacer 50.

After the step of FIG. 8(c), the lidded wavelength conversion device 60 and the temperature controlling IC 40 are bonded together in the same manner as previously described for the optical integrated device 1, to complete the fabrication of the optical integrated device 3.

As described above, according to the optical integrated devices 1 to 3, since all optical and electrical devices as components formed from dissimilar materials are bonded by surface activated bonding, the components can be easily laminated and mounted at low temperatures. As a result, even components such as optical and electrical devices between which the difference in thermal expansion coefficient is great can be mounted on the same substrate with high accuracy by suppressing warping of the substrate and eliminating any concern about their thermal histories.

Furthermore, since optical and electrical devices having different functions can be mounted together on the same substrate, the functionality of the optical integrated device can be increased, and the number of substrates needed to construct an apparatus that uses the optical integrated device can be reduced; as a result, the overall size and cost of the apparatus can be reduced, while increasing its reliability.

The optical integrated devices 1 to 3 have each been described above as having a laser diode and a wavelength conversion device as optical devices. However, the optical devices are not limited to these particular devices, but a prism, lens, mirror, beam former, diffraction grating, optical combiner, filter, interference device, etc. may be used as the optical devices, and such devices may be bonded by surface activated bonding via bonding portions formed from a metallic material capable of suitably deforming and having good electrical conductivity (for example, Au, Cu, or In).

What is claimed is:

1. An optical integrated device comprising:
   a substrate;
   a spacer having a micro-bump structure of Au formed on an upper surface thereof and bonded to said substrate by surface activated bonding;
   an optical device optically coupled to a first device mounted directly on said upper surface of said spacer; and
   an electrical device mounted directly on top of said optical device and having a thermal expansion coefficient which is different from said optical device, wherein said first device is bonded off center to said spacer by surface activated bonding via said micro-bump structure, said electrical device is bonded to said optical device by surface activated bonding via a bonding portion formed from a metallic material on said optical device, and a solid pattern of Au having the same height as said micro-bump structure and equalizing pressing force applied from above said spacer is formed on said upper surface of said spacer other than an area where said micro-bump structure is formed.

2. The optical integrated device according to claim 1, wherein said first device is a laser diode, and said optical device is a wavelength conversion device that outputs light by wavelength-converting laser light emitted by said laser diode.

3. The optical integrated device according to claim 2, wherein said electrical device is a temperature controlling IC that controls the temperature of said wavelength conversion device, and wherein said temperature controlling IC is bonded to said wavelength conversion device by surface activated bonding via said bonding portion formed on said wavelength conversion device.

4. The optical integrated device according to claim 1, wherein said bonding portion has a micro-bump structure of Au.

5. The optical integrated device according to claim 1, wherein said bonding accomplished by said surface activated bonding serves not only to electrically connect said electrical device to said substrate but also to firmly secure said electrical device in position.

6. The optical integrated device according to claim 1, wherein said solid pattern is formed so as to surround said area where said micro-bump structure is formed, other than an edge of said area facing said optical device.

* * * * *